United States Patent
Strader et al.

(10) Patent No.: US 9,330,998 B2
(45) Date of Patent: May 3, 2016

(54) THERMAL INTERFACE MATERIAL ASSEMBLIES AND RELATED METHODS

(71) Applicant: Laird Technologies, Inc., Earth City, MO (US)

(72) Inventors: Jason L. Strader, Cleveland, OH (US); Richard F. Hill, Parkman, OH (US)

(73) Assignee: Laird Technologies, Inc., Earth City, MO (US)

( * ) Notice: Subject to any disclaimer, the term of this patent is extended or adjusted under 35 U.S.C. 154(b) by 25 days.

(21) Appl. No.: 14/463,196

(22) Filed: Aug. 19, 2014

(65) Prior Publication Data

US 2015/0305189 A1    Oct. 22, 2015

Related U.S. Application Data

(60) Provisional application No. 61/981,336, filed on Apr. 18, 2014.

(51) Int. Cl.
*H01L 23/367*    (2006.01)
*H01L 23/373*    (2006.01)
*H01L 23/42*    (2006.01)

(52) U.S. Cl.
CPC .......... *H01L 23/367* (2013.01); *H01L 23/3677* (2013.01); *H01L 23/3735* (2013.01); *H01L 23/42* (2013.01); *H01L 23/3736* (2013.01); *H01L 23/3737* (2013.01)

(58) Field of Classification Search
CPC .................................................... H05K 7/205
See application file for complete search history.

(56) References Cited

U.S. PATENT DOCUMENTS

| 8,647,752 | B2 | 2/2014 | Strader et al. | |
| 2004/0261987 | A1* | 12/2004 | Zhang | B82Y 10/00 165/183 |
| 2006/0109632 | A1* | 5/2006 | Berlin | H01L 23/3677 361/719 |
| 2007/0120250 | A1* | 5/2007 | Fairchild | H01L 23/3677 257/712 |
| 2011/0310562 | A1* | 12/2011 | Strader | H05K 7/20472 361/704 |
| 2012/0276327 | A1 | 11/2012 | Cola et al. | |

OTHER PUBLICATIONS

Tgrease™ 980 Thermal Grease; www.lairdtech.com/thermal; Copyright 2010; 1 page.
Tgrease™ 300X Series Thermally Conductive Grease; Jun. 2013; www.lairdtech.com; 1 page.
Tpcm™ 900 Series; www.lairdtech.com; Jun. 6, 2006; 2 pages.
Tpcm™ FSF-52; www.lairdtech.com/thermal; Copyright 2010; 1 page.
Tpcm™ 780 Phase Change Material; www.lairdtech.com; Jun. 2013; 4 pages.
Tpcm™ 580 Series Phase Change Material; www.lairdtech.com/thermal; Copyright 2012; 2 pages.

(Continued)

*Primary Examiner* — Stephen W Smoot
(74) *Attorney, Agent, or Firm* — Harness, Dickey & Pierce, P.L.C.

(57) ABSTRACT

A thermal interface material assembly generally includes a substrate and one or more pillars protruding outwardly away from the substrate. A thermally-conductive heat path is at least partially defined by the substrate and the one or more thermally-conductive pillars, whereby heat may be transferable along the thermally-conductive heat path from a heat source of an electronic device.

16 Claims, 4 Drawing Sheets

(56) References Cited

OTHER PUBLICATIONS

Tgrease™ 880 Series Thermal Grease; www.lairdtech.com/thermal; Copyright 2010; 2 pagesacc.
Emerging Trends in Flip Chip; E. Van Vardaman; www.techsearchinc.com; accessed May 28, 2014; 15 pages.
TopLine WLP/WL-CSP Wafer Level Package; http://www.topline.tv/WLP.html; Feb. 13, 2014; pages.
PCB007 Karl's Tech Talk; Wafer Bumping Technology Choices; http://www.pcb007.com/pages/columns.cgi?clmid=62&artid=80748&_pf_=1; Copyright 2012; 3 pages.
International Search Report and Written Opinion issued in PCT International Application No. PCT/US2015/024055 dated Jul. 23, 2015; 14 pgs.; which claims priority to the instant application.

* cited by examiner

THERMAL INTERFACE MATERIAL ASSEMBLIES AND RELATED METHODS

CROSS-REFERENCE TO RELATED APPLICATION

This application claims priority to U.S. Provisional Patent Application No. 61/981,336 filed Apr. 18, 2014. The entire disclosure of the above application is incorporated herein by reference in its entirety.

FIELD

The present disclosure relates to thermal interface material assemblies and related methods.

BACKGROUND

This section provides background information related to the present disclosure which is not necessarily prior art.

Electrical components, such as semiconductors, transistors, etc., typically have pre-designed temperatures at which the electrical components optimally operate. Ideally, the pre-designed temperatures approximate the temperature of the surrounding air. But the operation of electrical components generates heat which, if not removed, can cause the electrical components to operate at temperatures significantly higher than normal or desirable operating temperatures. Such excessive temperatures may adversely affect the operating characteristics of the electrical components and the operation of any associated devices.

To avoid or at least reduce the adverse operating characteristics from the heat generation, the heat should be removed, for example, by conducting the heat from the operating electrical components to heat sinks. The heat sinks may then be cooled by conventional convection and/or radiation techniques. During conduction, the heat may pass from the operating electrical components to the heat sinks either by direct surface contact between the electrical components and heat sinks and/or by contact of the electrical components and heat sink surfaces through an intermediate medium or thermal interface material (TIM).

A thermal interface material may be used to fill the gap between thermal transfer surfaces, in order to increase thermal transfer efficiency as compared to having the gap filled with air, which is a relatively poor thermal conductor. In some devices, an electrical insulator may also be placed between the electrical component and the heat sink, in some cases this is the TIM itself.

SUMMARY

This section provides a general summary of the disclosure, and is not a comprehensive disclosure of its full scope or all of its features.

Example embodiments of the present disclosure generally relate to thermal interface material assemblies. In an example embodiment, a thermal interface material assembly generally includes a substrate and one or more pillars along a first and/or second side portion of the substrate.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 6:
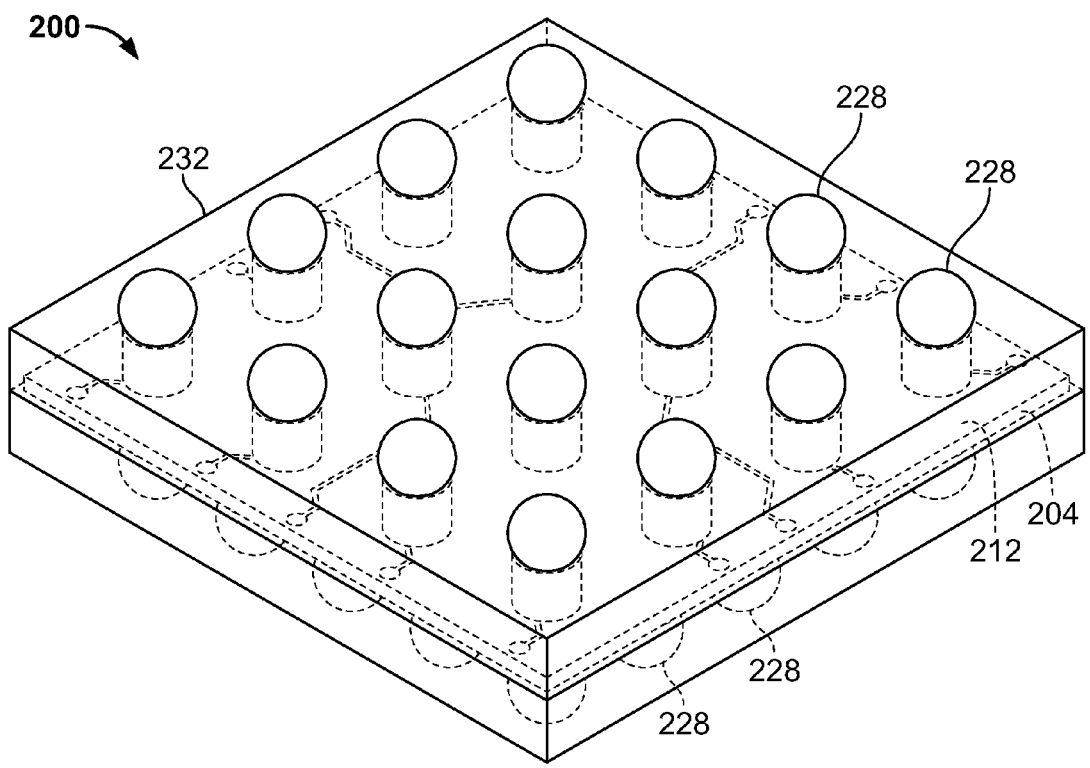
Figure 7:
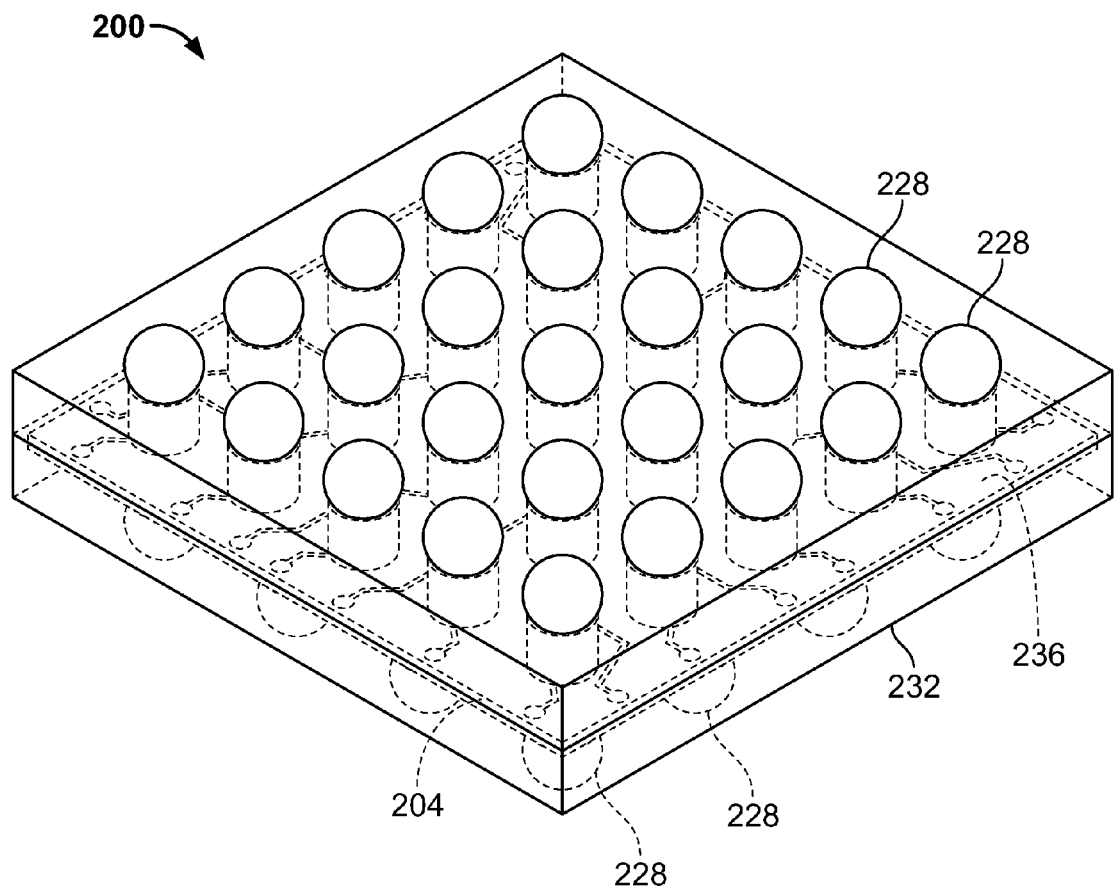

FIG. 6 is a perspective view of another example embodiment of a TIM assembly having solder balls supported by pillars that protrude outwardly from first and second side portions of a base of the TIM assembly, and showing a 4×4 array of solder balls and pillars along the first or upper side portion of the base of the TIM assembly; and FIG. 7 is a lower perspective view of the TIM assembly shown in FIG. 6, and showing a 5×5 array of solder balls and pillars along the second or lower side portion of the base of the TIM assembly.

Corresponding reference numerals indicate corresponding parts throughout the several views of the drawings.

DETAILED DESCRIPTION

Example embodiments will now be described more fully with reference to the accompanying drawings.

Disclosed herein are exemplary embodiments of thermal interface material (TIM) assemblies, which can be used, for example, to help conduct thermal energy (e.g., heat, etc.) away from a heat source of an electronic device (e.g., one or more heat generating components, central processing unit (CPU), die, semiconductor device, etc.). For example, a TIM assembly may be positioned generally between a heat source and a heat dissipating device (e.g., a heat spreader, a heat sink, a heat pipe, a device exterior case or housing, etc.) to establish a thermal joint, interface, pathway, or thermally-conductive heat path along which heat may be transferred (e.g., conducted) from the heat source to the heat dissipating device. During operation, the TIM assembly may then function to allow heat transfer (e.g., to conduct heat, etc.) of heat from the heat source along the thermally-conductive path to the heat dissipating device.

In exemplary embodiments, a TIM assembly includes a base (broadly, a substrate) and one or more pillars (broadly, supports) protruding outwardly or extending away from the base. The base and pillars may comprise copper or other thermally-conductive material.

Each pillar includes a first end portion and a second end portion opposite the first end portion. The pillar's first end portion may be in thermal contact with the base such that heat is transferrable between the pillar and the base. The pillar's first end portion may also be supported by and/or coupled (e.g., attached, etc.) to the base. The pillar's second end portion may be in thermal contact with a contact resistance reducer or thermal conductor, such that heat is transferrable between the pillar and the contact resistance reducer. As disclosed herein, the contact resistance reducer may reduce contact resistance by softening (e.g., melting, etc.) and flowing into rough surfaces to remove or push air out. Contact resistance is reduced as the contact resistance reducer has a lower thermal resistance and higher thermal conductivity than air, which is a relatively poor thermal conductor.

The contact resistance reducer may be supported by and/or coupled to the pillar's second end portion, such that the contact resistance reducer is spaced apart from the base with the pillar operating as or providing a stand-off. Accordingly, a pillar may also be referred to herein as a stand-off.

Example contact resistance reducers include solder balls, solder bumps, metals, metal alloys, low melting temperature metal alloys (e.g., $In_{51}Bi_{32.5}Sn_{16.5}$, a low melting temperature phase change metal alloy (PCMA) having a melting temperature of about 60 degrees Celsius, etc.), wax, composite materials, etc. In exemplary embodiments in which the contact resistance reducers comprise solder bumps and the pillars comprise copper, the copper pillars capped with solder bumps may be collectively referred to as copper pillar solder bumps. In exemplary embodiments, the contact resistance reducers have a softening temperature (e.g., melting temperature, state transition or phase change temperature, etc.) that is below, within, or above a normal operating temperature range of a heat source. For example, the contact resistance reducers may have a softening or melting temperature of about 160° C. and above a normal operating temperature range of a heat source (e.g., a CPU having a normal operating temperature from about 60° C. to 100° C. or from about 30° C. to 40° C., etc.).

Some embodiments include at least one pillar along each of the first (or upper) and second (or lower) side portions of the base. Other embodiments include one or more pillars along only a single side portion (but not both side portions) of the base.

In some embodiments, multiple pillars are disposed along either or both the first and second side surface portions of the base. The multiple pillars may be arranged in a predetermined pattern (e.g., a unique pattern customized or tailored for a particular device, generic pattern usable with different devices, etc.) along the base.

In some embodiments, a coating or encapsulation is applied to the substrate or base. The coating may be applied so as to cover or encapsulate the one or more pillars and the corresponding base's first and/or second side portions from which the one or more pillars protrude. The coating may also cover a portion of the contact resistance reducers on the pillars' second end portions. In some embodiments, the coating covers the lower portion of the contact resistance reducers (e.g., lower hemispherical portions of solder balls, etc.) sitting atop or coupled to the second end portions of the pillars. In other embodiments, the coating may totally cover the entirety of the contact resistance reducers (e.g., solder or solder balls, etc.) sitting atop or coupled to the second end portions of the pillars. In still other embodiments, the coating may be flush with the top of the contact resistance reducers (e.g., solder or solder balls, etc.) sitting atop or coupled to the second end portions of the pillars. Further embodiments may include thermally-conductive pillars without any contact resistance reducers sitting atop or coupled to the second end portions of the pillars. In these further embodiments, a coating or encapsulation is applied to the substrate or base, such that the coating thickness is equal to, thicker than, or thinner than the height of the pillars.

The coating may help inhibit oxidation of the base and the pillars by functioning as a barrier to air. In embodiments that include contact resistance reducers atop the pillars, the coating may also help inhibit oxidation of the portions of the contact resistance reducers (e.g., lower hemispherical portions of the solder balls, etc.) that are coated or covered by the coating. The coating may also help contain migration of the contact resistance reducers (e.g. solder balls, etc.) during operation of the TIM assembly. For example, the coating may operate as a barrier to generally contain or retain the solder balls on the pillars during operation of the TIM assembly so that the heated solder balls will not fall off (lose surface tension with the pillars) if the TIM assembly is inadvertently exposed to a shock.

The coating may comprise any suitable material, such as phase change materials (PCMs), polymers, paraffin waxes, gap fillers, greases, cured silicone pads, cured non-silicone pads, cure-in-place gels or putties, etc. depending on operational applications and/or desired properties of the TIM assembly. In exemplary embodiments that include coatings, the coating may comprise a material from Laird Technologies, such as Tpcm™ 580 series phase change materials, Tpcm™ 780, Tpcm™ FSF52, Tpcm™ 900 series phase change materials, Tgrease™ 300 X, Tgrease™ 880, Tgrease™ 980, etc.

The pillars may have a higher thermal conductivity than the contact resistance reducers on the pillars' second end portions. The contact resistance reducers may have a softening temperature (e.g., a melting temperature, state transition or phase change temperature, etc.) lower than the softening temperature of the pillars. In some embodiments, the contact resistance reducers may have a softening temperature that is below or within a normal operating temperature range of a heat source, such as a CPU (e.g., normal operating temperature from about 60° C. to 100° C. or from about 30° C. to 40° C., etc.). During operation of the electronic device, the contact resistance reducers may soften (e.g., melt, change phase, become flowable, etc.) to help improve surface contact (e.g., move or flow into surface imperfections or gaps, etc.) between the TIM assembly and another component, such as a heat source (e.g., one or more heat generating components of an electronic device, central processing unit (CPU), die, semiconductor device, etc.) and/or a heat dissipating device (e.g., a heat spreader, a heat sink, a heat pipe, a device exterior case or housing, etc.). Accordingly, the higher thermal conductivity of the pillars and the lower softening temperature of the contact resistance reducers cooperate to help define or provide a more efficient and better thermally-conductive heat path, e.g., between a heat source and a heat dissipating device.

In some embodiments, the pillars may also be moveable or conformable (e.g., have good compliance under stress, etc.) to allow for a better interface between the TIM assembly and another component (e.g., a heat source, a heat sink, etc.). The particular pattern, number of pillars (e.g., 5×5 array, 4×4 array, etc.), pillar height, pillar flexibility or deformability, pillar coverage area, and/or the materials used for the pillars, base or substrate, and contact resistance reducers may depend on the thermal performance required for the TIM assembly and particular electronic device in which it will be used. In one example embodiment, the TIM assembly may have a standalone bond line thickness of 5 mils and then have a bond line thickness of 3 mils when compressed between a heat source and heat dissipating device.

In alternative embodiments, a TIM assembly may include at least one thermally-conductive pillar without any contact resistance reducer (e.g., solder, solder ball, solder bump, etc.) in thermal contact (e.g., supported, coupled, attached, etc.)

with the second end portion of the at least one the thermally-conductive pillar. For example, a TIM assembly may include thermally-conductive pillars none of which include a contact resistance reducer thereon. Or, for example, a TIM assembly may include one or more thermally-conductive pillars without any contact resistance reducers thereon, and one more other thermally-conductive pillars having a contact resistance reducer thereon. As yet a further example, a TIM assembly may include thermally-conductive pillars all of which have a contact resistance reducer thereon.

Figure 1:
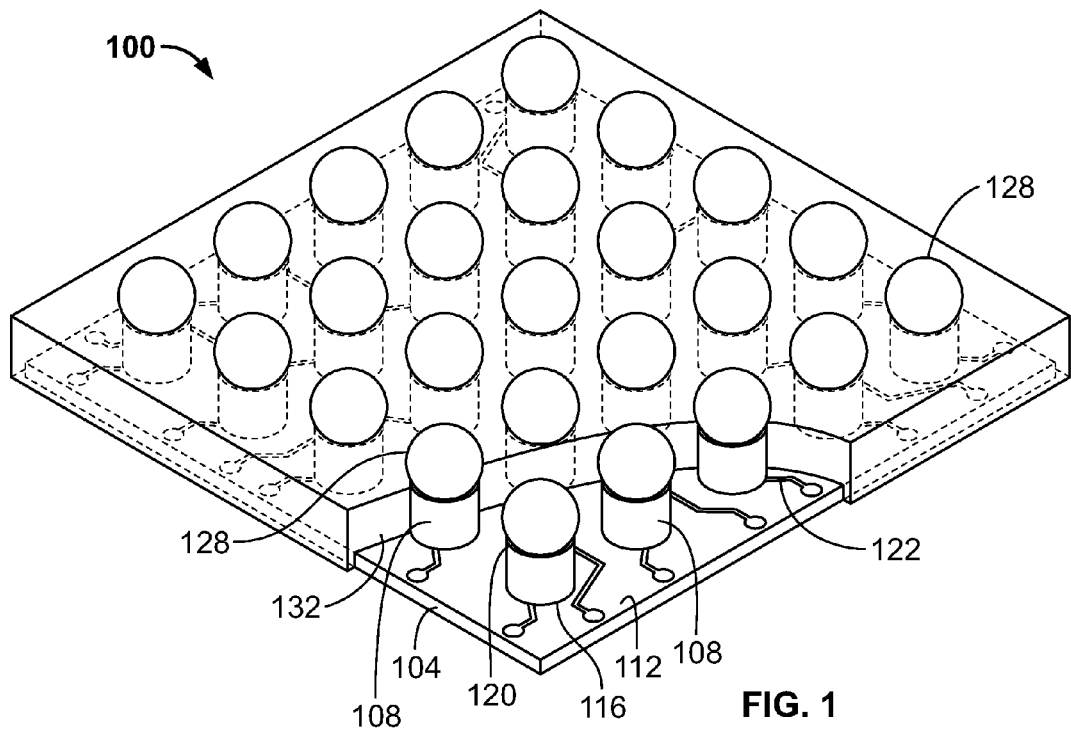
FIG. 1 is a perspective view of an example embodiment of a thermal interface material (TIM) assembly having solder balls supported on top of pillars that protrude outwardly away from a first side portion of a base of the TIM assembly, where a portion of an encapsulation or coating is removed for clarity in order to show the pillars.
Figure 2:
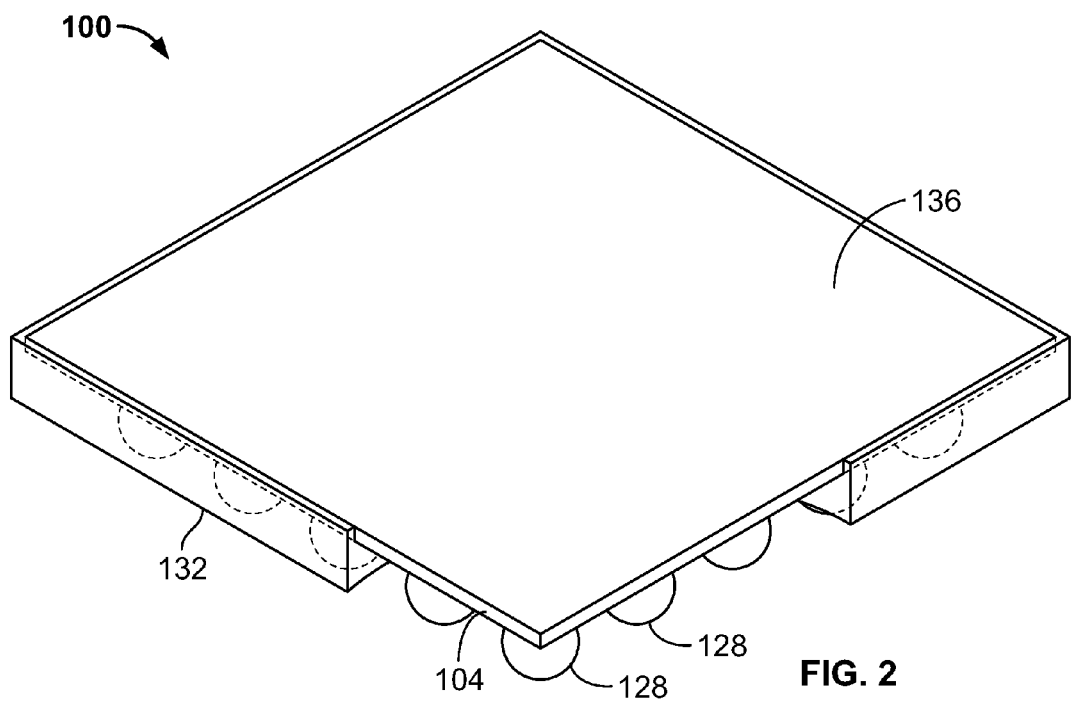
FIG. 2 is a lower perspective view of the TIM assembly shown in FIG. 1.

With reference now to the drawings, FIGS. 1 through 5 illustrate an example embodiment of a thermal interface material (TIM) assembly 100 including one or more aspects of the present disclosure. As shown in FIG. 1, the illustrated TIM assembly 100 includes a base 104 (broadly, a substrate) and multiple pillars 108 (broadly, supports) protruding outwardly or extending away from a first or upper side portion 112 of the base 104.

Each pillar 108 includes a first end portion 116 and a second end portion 120 opposite the first end portion 116. The first end portion 116 is in thermal contact with the first side portion 112 of the base 104 such that heat is transferable between the pillar 108 and the base 104. The pillar's first end portion 116 may also be supported by and/or coupled (e.g., attached, etc.) to the base 104. For example, the first end portions 116 of the pillars 108 may be soldered to the base 104. In this illustrated embodiment, the TIM assembly 100 also includes a redistribution 122 that helps to redistribute heat transferred from the pillars 108 to the base 104. In this example, the redistribution 122 includes copper elements (e.g., copper traces, etc.) extending outwardly relative from the pillars' first end portions 116 along different areas of the base 104.

The second end portion 120 of each pillar 108 is in thermal contact with a solder ball 128 (broadly, a contact resistance reducer or thermal conductor) such that heat is transferrable between the solder ball 128 and the pillar 108. The solder ball 128 may also be supported by and/or coupled to (e.g., via solder reflow, etc.) the pillar's second end portion 120, such that the solder ball 128 is spaced apart from the base 104 and with the pillar 108 operating as or providing a stand-off for the solder ball 128.

Figure 3:
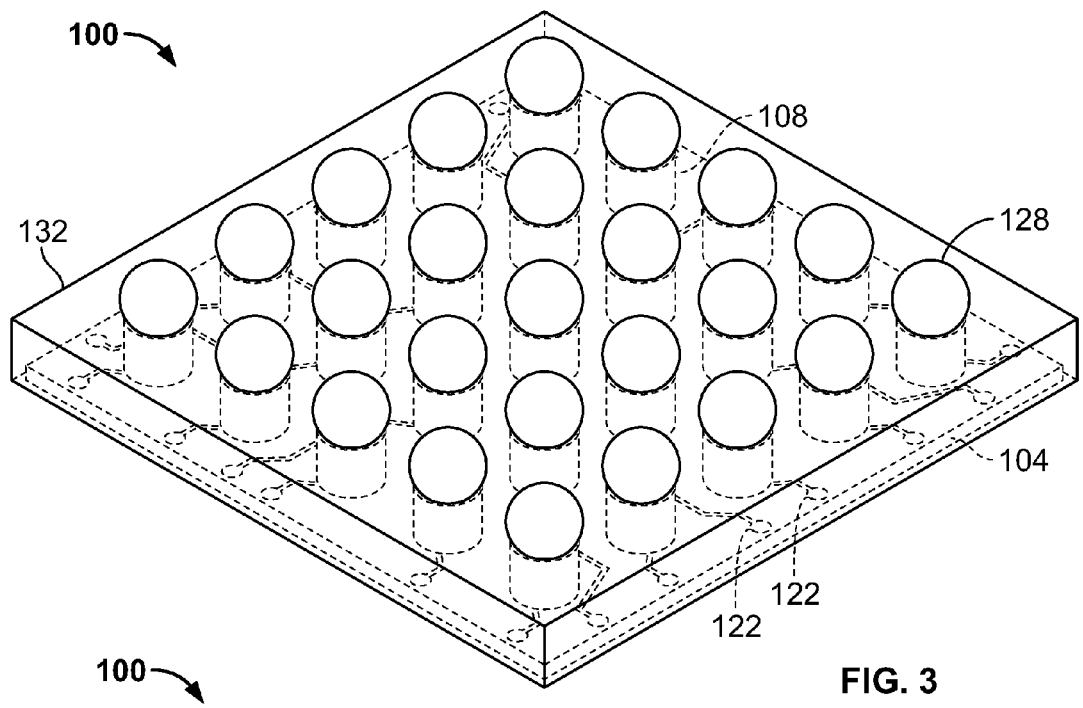
FIG. 3 is an upper perspective view of the TIM assembly shown in FIG. 1 without the removed portion of the encapsulation or coating such that the entire encapsulation or coating is shown.
Figure 4:
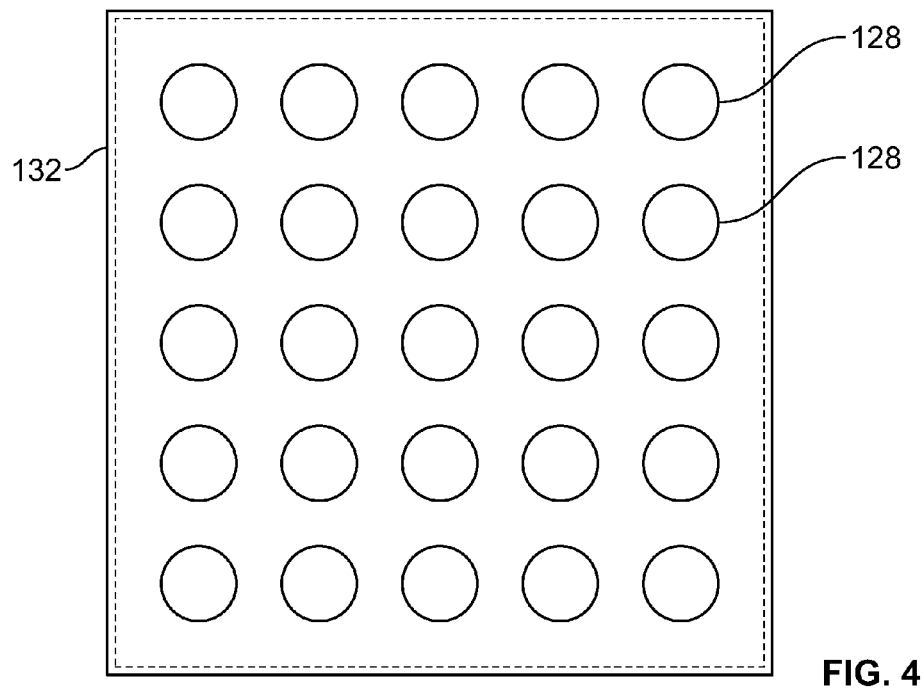
FIG. 4 is an upper plan view of the TIM assembly shown in FIG. 3.
Figure 5:
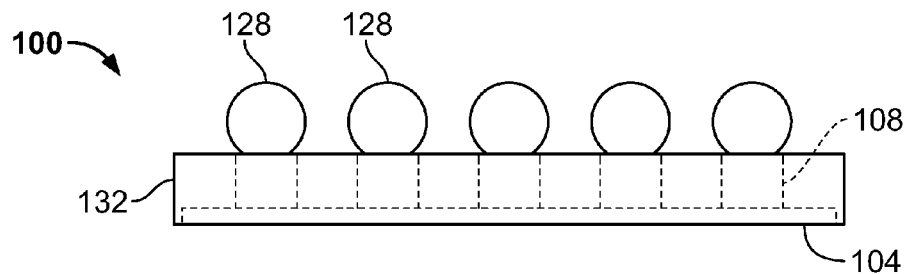
FIG. 5 is an elevation view of the TIM assembly shown in FIG. 3.

A coating or encapsulation 132 is applied to the base 104 and the pillars 108. As shown in FIGS. 1 and 3, the coating 132 may be applied so as to cover or encapsulate the pillars 108 and the base's first side portion 112 from which the pillars 108 protrude. The coating 132 may also cover a lower portion of the solder balls 128. In this example, the second side portion 136 of the base 104 does not include pillars 108 and solder balls 128. The base's second side portion 136 may include a coating that is the same as or different than the coating 132 in some embodiments.

The base 104 is configured to conduct thermal energy across the base 104 as desired, for example, from the first side portion 112 of the base 104 to the opposing second side portion 136 of the base 104 for use in cooling a heat source (e.g., heat generating component of an electronic device, etc.). The illustrated base 104 is constructed from copper having a thermal conductivity of about 400 Watts per meter Kelvin; and the copper is made into a foil (e.g., such that the base 104 is a foil layer, etc.) having a thickness of about 0.002 inches (about 0.05 millimeters). The base 104 may, however, be constructed from another suitable thermally-conductive material, for example, a metal other than copper (e.g., tin, nickel, silver, gold, nickel plated copper, nickel plated aluminum, another metal that can be made into a foil, etc.), a metal alloy, a metallic foil, a ceramic material sputter coated with a metal (e.g., gold, solder, etc.), a graphite material sputter coated with a metal (e.g., gold, solder, etc.), etc. In addition, the base 104 may have any desired thermal conductivity and/or any desired thickness, for example, a thermal conductivity greater than or less than about 400 Watts per meter Kelvin and/or a thicknesses greater than or less than about 0.002 inches (about 0.05 millimeters), etc. Moreover, the base 104 may have any desired shape, e.g., rectangular, square, etc.

The pillars 108 are configured to conduct thermal energy between the base 104 and the solder balls 128. The pillars 108 may preferably comprise a material having a thermal conductivity greater than the thermal conductivity of the solder balls 128. The pillars 108 may also comprise a material having good compliance when the TIM assembly 100 is compressively sandwiched between a heat source and another component. The pillars 108 may be moveable or conformable to allow for a better interface between the TIM assembly 100 and another component (e.g., a heat source, a heat sink, etc.). In this illustrated embodiment, the pillars 108 comprise copper having a thermal conductivity of about 360 Watts per meter Kelvin. The pillars 108 may, however, be constructed from another suitable thermally-conductive material, for example, a metal other than copper (e.g., tin, nickel, silver, gold, nickel plated copper, nickel plated aluminum, etc.), a metal alloy, a ceramic material sputter coated with a metal (e.g., gold, solder, etc.), a graphite material sputter coated with a metal (e.g., gold, solder, etc.), etc.

The solder balls 128 operate as part of the TIM assembly 100 to help conduct thermal energy to and/or away from the pillars 108 as desired (e.g., from a heat source to the pillars 108, from the pillars 108 to a heat dissipating device, etc.). The illustrated solder balls 128 comprise $In_{51}Bi_{32.5}Sn_{16.5}$, which is a low melting phase change alloy (PCMA) having a melting temperature of about 60 degrees Celsius. The solder balls 128 may, however, be formed from another suitable thermally-conductive material, for example, a low melting PCMA other than $In_{51}Bi_{32.5}Sn_{16.5}$, an eutectic metal alloy, a non-eutectic metal alloy, a metal or a metal alloy with a melting temperature below about 160 degrees Celsius, other metals or metal alloys, etc.

The solder balls 128 have a softening temperature (e.g., a melting temperature, state transition or phase change temperature, etc.) lower than the softening temperature of the pillars 108. The solder balls 128 may have a softening temperature that is below, within, or above a normal operating temperature range of a heat source. For example, the solder balls 128 may have a softening temperature that is below or within a normal operating temperature range of a heat source, such as a CPU (e.g., normal operating temperature from about 60° C. to 100° C. or from about 30° C. to 40° C., etc.). During operation of the electronic device, the solder balls 128 may soften (e.g., melt, change phase, become flowable, etc.) to help improve surface contact (e.g., move or flow into surface imperfections or gaps, etc.) between the TIM assembly 100 and another component, such as a heat source (e.g., one or more heat generating components of an electronic device, central processing unit (CPU), die, semiconductor device, etc.) and/or a heat dissipating device (e.g., a heat spreader, a heat sink, a heat pipe, a device exterior case or housing, etc.). The combination of the higher thermal conductivity of the pillars 108 and the lower softening temperature of the solder balls 128 helps to define or provide a more efficient and better heat path. For example, the pillars 108 may comprise copper having a thermal conductivity of about 360 W/mK (Watts per meter-Kelvin) and a softening temperature of 1085° C., while the solder balls 128 may comprise $In_{51}Bi_{32.5}Sn_{16.5}$ having a thermal conductivity of about 19 W/mK and a softening temperature of 60° C.

In the illustrated embodiment, the solder balls 128 are shaped as generally circular bumps soldered (broadly, coupled) to the pillar second end portions 120. The solder balls 128 may be located generally uniformly (e.g., in generic patterns suitable for use with multiple different heat sources or heat generating components, etc.) along the entire first side portion 112 such that the solder balls 128 substantially cover the entire surface of the first side portion 112.

In the illustrated embodiment of FIG. 1, only the base's first side portion 112 includes solder balls 128 and pillars 108. The solder balls 128 and pillars 108 are oriented in a 5×5 array having five rows and five columns of solder balls 128 and pillars 108. In other embodiments, there may be pillars and solder balls in different configurations, such as pillars and solder balls along both of the base's side portions (e.g., TIM assembly 200 shown in FIGS. 6 and 7, etc.), in a different array (e.g., 4×4, 6×6 array, etc.), and/or more or less than twenty-five along either or both side portions, etc. In addition, the solder balls 128 may have any suitable size depending on the particular application. In other example embodiments, TIM assemblies may include pillars and solder balls oriented across one or more side portions of bases differently than illustrated in FIGS. 1 and 6 (e.g., other than uniformly, etc.). For example, pillars and solder balls may be provided in desired patterns (e.g., bulls-eye patterns, stripe patterns, zigzag patterns, etc.); in patterns based on particular operational requirements of the TIM assemblies (e.g., based on cooling requirements, etc.); in patterns based on sizes and/or shapes of heat generating components to be cooled; in patterns corresponding to particular locations on heat generating components away from which heat is to be conducted by the TIM assemblies; in generic patterns that do not specifically match particular locations on heat generating components away from which heat is to be conducted but that are configured such that the TIM assemblies may be used with multiple different heat generating components to effectively conduct heat away from the multiple different heat generating components, etc.

In still other example embodiments, TIM assemblies may include bases having pillars and solder balls over only parts of the bases. In still other example embodiments, TIM assemblies may include bases having pillars and solder balls provided over parts of the bases at specific locations and/or in specific patterns corresponding to one or more hot spots on surfaces of heat generating components to which the TIM assemblies are to be coupled. Here, the pillars and solder balls may be provided in desired patterns generally mirroring the one or more hot spots on the heat generating components' surfaces. This may allow for higher thermal transfer over the one or more hot spots while maintaining acceptable performance over other areas of the heat generating components' surfaces. And moreover, the remainder of the bases may be coated with coating material to help inhibit oxidation of the solder balls and further help cool the one or more hot spots on the heat generating components' surfaces as desired.

With continued reference to FIGS. 1 and 3, the coating 132 is configured to help inhibit oxidation of the base 104, the pillars 108, and portion of the solder balls 128 by functioning as a barrier to air. The coating 132 is also configured to help contain migration of the solder balls 128 during operation of the TIM assembly 100. For example, the coating 132 operates as a barrier to generally contain the solder balls 128 on the pillars 108 during operation of the TIM assembly 100 so that the heated solder balls 128 will not fall off (lose surface tension with the pillars 108) if the TIM assembly 100 is inadvertently exposed to a shock.

The coating 132 may include any suitable material including, for example, phase change materials (PCM's), polymers, paraffin waxes, gap fillers, greases, cured silicone pads, cured non-silicone pads, cure-in-place gels or putties, etc. depending on operational applications and/or desired properties of the TIM assembly 100. The coating 132 may have any suitable softening temperature, for example, a softening temperature that is lower than, about the same as, etc. the softening temperature of the solder balls 128. For example, the illustrated coating 132 may have a softening temperature of between about 40 degrees Celsius and about 60 degrees Celsius. And, the coating 132 may be softer than the solder balls 128. The coating 132 may also have any desired thickness within the scope of the present disclosure. For example, the coating 132 may have a thickness that is thinner than the height of the pillars 108, or the coating 132 may have a thickness that is about the same as the height of the pillars 108, or thicker than the height of the pillars 108.

The coating 132 may also help take up mismatches in coefficients of thermal expansion between the TIM assembly 100 and a heat source to which the TIM assembly 100 is coupled at operating temperatures below the softening temperature of the solder balls 128. As such, the coating 132 may provide a more conformable/compliant material (e.g., material having a shore 00 to shore A hardness, etc.) at these lower temperatures as compared to the solder balls 128 (which are harder with a hardness not measurable on the shore 00 or shore A scale). The coating 132 improving surface contact between the TIM assembly 100 and the heat source (e.g., for better conformance to gaps/surface imperfections in a heat generating component, etc.) and thus help create a better heat path therebetween. At operating temperatures above the softening temperature of the solder balls 128, the coating 132 and the solder balls 128 may soften, melt, and flow into imperfections in the heat source to thereby together help improve surface contact between the TIM assembly 100 and the heat source. The solder balls 128 and/or the coating 132 may thus also provide a naturally tacky adhesion to the heat source and/or a heat dissipating device.

The coating 132 may also operate as part of the TIM assembly 100 to help conduct at least some thermal energy to and/or away from the base 104 as desired (e.g., from a heat source to the base 104, from the base 104 to a heat dissipating device, etc.). Further, the coating 132 may be thermally enhanced as desired to improve/enhance conduction of thermal energy through the coating material to and/or away from the base 104. For example, additives such as ceramic particles, metallic particles, etc. may be added to the coating 132 to provide such improved/enhanced conduction of thermal energy.

As previously noted, wide ranges of different coatings may be used in example embodiments of TIM assemblies of the present disclosure. In some example embodiments, for example, coating materials may have thermal conductivities of at least about 1 W/mK (Watts per meter-Kelvin) or more, such as copper-based coatings having thermally conductivities up to several hundred W/mK, etc. Additional suitable coating materials may include, for example, zinc oxide, boron nitride, alumina, aluminum, graphite, ceramics, combinations thereof (e.g., alumina and zinc oxide, etc.). In addition, example embodiments of TIM assemblies may also include different grades (e.g., different sizes, different purities, different shapes, etc.) of the same (or different) coatings. For example, TIM assemblies may include two different sizes of boron nitride, etc. By varying the types and grades of coating materials, final characteristics of the TIM assemblies (e.g., thermal conductivity, cost, hardness, etc.) may be varied as desired.

Suitable coatings may also include other additives to so that TIM assemblies formed using the coatings can achieve various desired outcomes. For example, coatings may further include pigments, plasticizers, process aids, flame retardants, extenders, electromagnetic interface (EMI) or microwave absorbers, electrically-conductive fillers, magnetic particles, tackifying agents to increase the tackiness of a thermal interface material, etc.

In other exemplary embodiments, the pillars 108 may be on a base or substrate 104 (e.g., copper, etc.) having a sufficiently high thermal conductivity such that the redistribution 122 (e.g., copper traces, etc.) is not necessary or required to redistribute the heat. Accordingly, some exemplary embodiments include a TIM assembly that does not include the redistribution 122. In some exemplary embodiments that include a redistribution, copper traces may be printed on a substrate, and pillars may be provided on the traces only in the areas of interest to remove and transport heat. This may be accomplished by etching away traces on a substrate that was totally coated with copper, and then adding bumps. Or, for example, copper may be printed to plastic using an ink in only the areas desired to have the copper. Bumps may be built up via current production method or potentially areas of thicker ink or additional layers of ink. As another example, thermally-conductive pins (e.g., copper pins, etc.) may be pushed through a substrate to create the pillars instead of soldering to create the pillars.

FIGS. 6 and 7 illustrate another example embodiment of a TIM assembly 200 including one or more aspects of the present disclosure. The TIM assembly 200 of this embodiment is similar to the TIM assembly 100 previously described and illustrated in FIGS. 1 through 5. For example, the illustrated TIM assembly 200 includes a base 204 (broadly, a substrate), multiple pillars 208 (broadly, supports), solder balls 228 (broadly, contact resistance reducers or thermal conductors), and coating 212. But in this example, there are pillars 208, solder balls 228, and the coating 212 along each of the first and second side portions 212, 236 of the base 204. As shown in FIG. 6, there is a 4×4 array of pillars 208 and solder balls 228 along the base's first or upper side portions 212. FIG. 7 shows the 5×5 array of pillars 208 and solder balls 228 along the base's second or lower side portion 236.

In other example embodiments, TIM assemblies may be included as part of electromagnetic interference (EMI) devices. EMI may include both electromagnetic interference and radio frequency interference (RFI) emissions. In these example embodiments, coatings in the TIM assemblies may be configured to provide at least some EMI shielding. For example, the coatings may include magnetic particles, EMI or microwave absorbers, electrically conductive fillers, or electromagnetic absorbing materials, such as carbonyl iron, iron silicide, iron particles, iron-chrome compounds, metallic silver, carbonyl iron powder, SENDUST (an alloy containing 85% iron, 9.5% silicon and 5.5% aluminum), permalloy (an alloy containing about 20% iron and 80% nickel), ferrites, magnetic alloys, magnetic powders, magnetic flakes, magnetic particles, nickel-based alloys and powders, chrome alloys, and any combinations thereof. Other embodiments may include one or more EMI absorbers formed from one or more of the above materials where the EMI absorbers comprise one or more of granules, spheroids, microspheres, ellipsoids, irregular spheroids, strands, flakes, powder, and/or a combination of any or all of these shapes.

An example method for making a TIM assembly (e.g., TIM assembly 100, TIM assembly 200, etc.) will now be described. Copper foil (broadly, a substrate) is coated (e.g., laminated, etc.) with a dry film photo resist that is then covered with a transparency (e.g., a stencil, etc.) having a desired pattern. The dry film photo resist is then subjected to a curing operation using ultraviolet light. Portions of the dry film photo resist not covered by the transparency are cured. And, portions of the dry film photo resist covered with the transparency (corresponding to the pattern of the transparency) are not cured. The uncured portions of the dry film photo resist are washed away using a dry film developer. This leaves exposed areas of bare copper over the surface of the copper foil corresponding to the pattern from the transparency.

Copper pillars are formed at the exposed areas of bare copper by a plating process. The copper pillars are then provided with the contact resistance reducers by a plating process. For example, the copper pillars may be plated with a metal alloy by dipping the second end portions of the copper pillars into flux and then molten solder (e.g., $In_{51}Bi_{32.5}Sn_{16.5}$, etc.) to thereby broadly couple the solder to the second end portions of the copper pillars. Alternatively, wax may be used instead of solder in some embodiments.

The resulting product is then cooled to room temperature, rinsed, and dried, leaving dome-shaped solder bumps on the copper pillars. The copper pillar bump plated copper foil is processed (e.g., placed in a dry film stripper, etc.) to remove the cured dry film photo resist from the copper foil. The resulting product is washed and dried, leaving only the copper pillar bump plated copper foil (with copper pillar solder bumps at the desired locations corresponding to the original transparency). The pattern may be arranged as desired, for example, in a generic pattern or so that the locations of the copper pillar solder bumps generally correspond to locations on a heat source to be cooled when the TIM assembly is coupled to the heat generating component, etc.

The copper pillar solder bump plated copper foil is then coated (e.g., backfilled, etc.) with a coating using suitable operations. As an example, the coating can be dissolved in a solvent, and then the copper pillar solder bump plated copper foil may be dipped into the liquid solution thereby coating at least part of the solder bumps, the copper pillars, and copper foil. The solvent is then flashed off leaving the TIM assembly. In preparing the TIM assembly for subsequent storage, distribution, use, etc., liners may (although it is not required) then be introduced to the TIM assembly while the TIM assembly is sheeted or wound up into a roll. As another example, the coating may be preformed into rolls of material of desired thicknesses and then laminated to side surfaces of the copper pillar solder bump plated copper foil with laminating rolls. The resulting TIM assembly may then be sheeted or rolled up. And as still another example, the coating may be of a lower softening point than the solder bumps such that the coating may be heated above its softening temperature and then laminated to the copper pillar solder bump plated copper foil. This can include applying the molten coating to liners, introducing the liners to upper and lower side surfaces of the copper pillar solder bump plated copper foil, and then moving the entire assembly through laminating rolls. The laminating rolls and support table leading up to them will be heated to a temperature that is greater than the softening temperature of the coating but below the softening temperature of the solder bumps. Upon exiting the laminating rolls, the TIM assembly material can then be sheeted or wound into a roll.

In other example embodiments, methods for making TIM assemblies may include screen printing bases with solder pastes in desired patterns and then processing the printed bases through reflow ovens. In still other example embodiments, methods for making TIM assemblies may include directly plating heat dissipating devices, heat sources, etc. with metals or metal alloys (e.g., solder, etc.) to thereby provide pillars and contact resistance reducers thereon. Suitable coatings are then applied to the plated portions of the heat dissipating devices, heat sources, etc. using, for example, solvent systems and stencils, etc. In some example embodiments, surfaces of the heat dissipating devices, heat sources, etc. that are to be coated may need to be pre-coated with metal such as gold, nickel, etc. to provide a suitable surface to which the metal or metal alloys can be plated.

A wide variety of materials may be used for the coating in exemplary embodiments disclosed herein. For example, the coating may comprise phase change materials (PCMs), polymers, paraffin waxes, gap fillers, greases, cured silicone pads, cured non-silicone pads, cure-in-place gels or putties, etc. depending on operational applications and/or desired properties of the TIM assembly. By way of further example, the coating may comprise a material from Laird Technologies, such as Tpcm™ 580 series phase change materials, Tpcm™ 780, Tpcm™ FSF52, Tpcm™ 900 series phase change materials, Tgrease™ 300 X, Tgrease™ 880, Tgrease™ 980, etc. The seven tables below provide properties for these non-limiting examples of materials that may be used for a coating in exemplary embodiments.

TABLE 1

Tpcm ™ 580 series phase change materials

| PROPERTIES | Tpcm ™ 583 | Tpcm ™ 585 | Tpcm ™ 588 | Tpcm ™ 5810 | Tpcm ™ 5816 |
|---|---|---|---|---|---|
| Construction & composition | | | Non-reinforced film | | |
| Color | | | Gray | | |
| Thickness | 0.003" (0.076 mm) | 0.005" (0.127 mm) | 0.008" (0.2 mm) | 0.010" (0.25 mm) | 0.016" (0.406 mm) |
| Density | | | 2.87 g/cc | | |
| Operating temperature range | | | −40° C. to 125° C. (−40° F. to 257° F.) | | |
| Phase change softening temperature | | | 50° C. (122° F.) | | |
| Thermal resistance | | | | | |
| 10 psi | 0.019° C.-in$^2$/W (0.12° C.-cm$^2$/W) | 0.020° C.-in$^2$/W (0.13° C.-cm$^2$/W) | 0.020° C.-in$^2$/W (0.13° C.-cm$^2$/W) | 0.020° C.-in$^2$/W (0.13° C.-cm$^2$/W) | 0.025° C.-in$^2$/W (0.16° C.-cm$^2$/W) |
| 20 psi | 0.016° C.-in$^2$/W (0.10° C.-cm$^2$/W) | 0.016° C.-in$^2$/W (0.10° C.-cm$^2$/W) | 0.016° C.-in$^2$/W (0.10° C.-cm$^2$/W) | 0.016° C.-in$^2$/W (0.10° C.-cm$^2$/W) | 0.016° C.-in$^2$/W (0.10° C.-cm$^2$/W) |
| 50 psi | 0.013° C.-in$_2$/W (0.08° C.-cm$^2$/W) | 0.013° C.-in$^2$/W (0.08° C.-cm$^2$/W) | 0.013° C.-in$^2$/W (0.08° C.-cm$^2$/W) | 0.013° C.-in$^2$/W (0.08° C.-cm$^2$/W) | 0.013° C.-in$^2$/W (0.08° C.-cm$^2$/W) |
| Thermal conductivity | | | 3.8 W/mK | | |
| Volume resistivity | | | 3.0 × 10$^{12}$ ohm-cm | | |

TABLE 2

Tpcm ™ 780 phase change material

| PROPERTIES | Tpcm ™ 780 | TEST METHOD |
|---|---|---|
| Color | Grey | Visual |
| Thickness, inches (mm) | 0.008" (0.203), 0.010° (0.254) 0.016" (0.406), 0.025° (0.635) | |
| Thickness Tolerance, inches (mm) | ±0.0008" (0.0203), ±0.0010° (0.0254) ±0.0016" (0.0406), ±0.0025° (0.0635) | |
| Construction & Composition | Non-reinforced Film | |
| Specific Gravity, g/cc | 2.48 | Helium Pycnometer |
| Phase Change Softening Range, ° C. | ~45° C. to 70° C. | |
| Thermal Conductivity, W/mK | 5.4 | Hot Disk Thermal Constants Analyzer |
| Hardness (Shore 00) | 85 3 sec @ 21 C. | ASTM D2240 |
| Thermal Resistance | | |
| 70° C., 345 kPa, ° C.-cm$^2$/W (50 psi, ° C.-in$^2$/W) | 0.025 (0.004) | ASTM D5470 (modified) |
| Outgassing TML | 0.51% | ASTM E595 |
| Outgassing CVCM | 0.20% | ASTM E595 |

TABLE 3

Tpcm ™ FSF52 free standing film phase change material

| PROPERTIES | TPCM FSF-52 | TEST METHOD |
|---|---|---|
| Construction & Composition | Ceramic filled wax based free standing film | |
| Color | White | Visual |
| Thickness | 0.005" (0.125 mm) | |
| Thickness Tolerance | +/−0.001° (0.025 mm) | |

TABLE 3-continued

Tpcm ™ FSF52 free standing film phase change material

| PROPERTIES | TPCM FSF-52 | TEST METHOD |
|---|---|---|
| Density | 2.0 g/cc | Helium Pycnometer |
| UL Flammability Rating | 94 V0 | |
| Phase Change Temperature | 52° C. | |
| Thermal Conductivity | 0.9 W/mK | ASTM D5470 |
| Thermal Resistance | | |
| @ 10 psi | 0.042 C.-in²/W (0.27 C.-cm²/W) | ASTM D5470 |
| @ 50 psi | 0.030 C.-in²/W (0.19 C.-cm²/W) | (modified) |
| Dielectric constant: @ 1 KHz/1 MH | 3.8/3.4 | ASTM D150 |
| Volume resistivity | $7.9 \times 10^{13}$ | ASTM D257 |

TABLE 4

Tpcm ™ 900 series phase change materials

| | Tpcm ™ 905C | Tpcm ™ 910 | Tpcm ™ 920 | Test Method |
|---|---|---|---|---|
| Construction & Composition | Non-reinforced boron nitride filled film | Non-reinforced boron nitride filled film | Non-reinforced boron nitride filled film | |
| Color | Yellow | Yellow | Yellow | visual |
| Thickness | 0.005" (0.13 mm) | 0.010" (0.25 mm) | 0.020" (0.51 mm) | |
| Thickness Tolerance | ±0.001" (±0.025 mm) | ±0.001" (±0.025 mm) | ±0.002" (±0.05 mm) | |
| Density | 1.31 g/cc | 1.39 g/cc | 1.39 g/cc | Helium Pycnometer |
| Temperature Range | −25 to 125° C. | −25 to 125° C. | −25 to 125° C. | |
| Phase Change Softening Temperature | 50° C. to 70° C. | 50° C. to 70° C. | 50° C. to 70° C. | |
| "Burn In" Temperature | 70° C. for 5 minutes | 70° C. for 5 minutes | 70° C. for 5 minutes | |
| Thermal Conductivity | 0.7 W/mK | 2.23 W/mK | 2.23 W/mK | ASTM D5470 (modified) |
| Thermal Impedance | | | | |
| @ 10 psi (69 KPa) | 0.048° C.-in²/W (0.31° C.-cm²/W) | 0.14° C.-in²/W (0.90° C.-cm²/W) | 0.18° C.-in²/W (1.14° C.-cm²/W) | ASTM D5470 (modified) |
| @ 50 psi (345 KPa) | 0.029° C.-in²/W (0.19° C.-cm²/W) | 0.083° C.-in²/W (0.53° C.-cm²/W) | 0.095° C.-in²/W (0.61° C.-cm²/W) | |
| Volume Resistivity | $2 \times 10^{13}$ ohm-cm | $2 \times 10^{13}$ ohm-cm | $2 \times 10^{13}$ ohm-cm | ASTM D257 |
| Dielectric Constant @ 1 MHz | 3.1 | 3.1 | 3.1 | ASTM D150 |

TABLE 5

Tgrease ™ 300X silicone-based thermal grease

| TYPICAL PROPERTIES | | TEST METHOD |
|---|---|---|
| Color | Gray | Visual |
| Density | 2.87 g/cc | Helium Pycnometer |
| Viscosity | 400,000 cP | Brookfield DV-II Helipath Spindle T-F 20 RPMs |
| Thixotropic Index | 3.35 | Brookfield Viscometer RPMs |
| Thermal Resistance | | |
| @ 50 psi | 0.013° C.-in²/W | ASTM D5470 |
| @ 344 7 kPA | 0.084° C.-in²/W | (modified) |
| Thermal Conductivity | 3.0 W/mk | Hot disk thermal constants analyzer |
| Bond Line Thickness | 0.001 in, 25 microns | |

TABLE 6

Tgrease ™ 880 silicone-based thermal grease

| PROPERTIES | |
|---|---|
| Color | Grey |
| Density | 2.73 g/cc |
| Viscosity | <1,500,000 cps |
| Brookfield Viscometer | TF spindle at 2 rpm (helipath) and 23° C. |
| Temperature Range | −40-150° C. (−40-302° F.) |
| UL Flammability Rating | 94 V0. File E180840 |
| Thermal Conductivity | 3.1 W/mK |
| Thermal Resistance | |
| @ 10 psi | 0.014° C.-in²/W (0.090° C.-cm²/W) |
| @ 20 Psi | 0.010° C.-in²/W (0.065° C.-cm²/W) |
| @ 50 psi | 0.009° C.-in²/W (0.058° C.-cm²/W) |
| Volume Resistivity (ASTM D257) | $9 \times 10^{13}$ Ohm-cm |

TABLE 7

Tgrease ™ 980 silicone-based thermal grease

| TYPICAL PROPERTIES | | | TEST METHOD |
|---|---|---|---|
| Color | | Gray | Visual |
| Density | 2.73 | g/cc | Helium pycnometer |
| Viscosity at 23° C. (cps) | 85,000 | (with solvent) | Brookfield heliapath Spindle T-E at 10 RPMs |
| Volatile content | 0.15% | (without solvent) | ASTM E595 |
| Volatile content with solvent | 0.85% | (with solvent) | ASTM E595 + solvent content |
| Thermal conductivity | 3.8 | W/mK | Hot disk thermal constants analyzer |
| Thermal resistance | | | |
| @ 50 psi | 0.010° | C.-in$^2$/W | ASTM D5470 |
| @ 344.7 KPa | 0.064° | C.-in$^2$/W | (modified) |
| Operating temperature range | −40-150° | C. (40-302° F.) | |

Accordingly, example embodiments of the present disclosure generally relate to assemblies and methods for helping conduct thermal energy (e.g. heat, etc.) away from heat generating components. As used herein, heat generating components may include, but are not limited to, computer chips, braking systems, heating elements, power converters, amplification chips, insulated-gate bipolar transistors (IGBT), graphics processing units (GPU), memory chips, semiconductors, transistors, any various other electronics system components, etc. The example embodiments of the present disclosure may also be used in connection with electromagnetic shielding.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances. Or, for example, the term "about" as used herein when modifying a quantity of an ingredient or reactant of the invention or employed refers to variation in the numerical quantity that can happen through typical measuring and handling procedures used, for example, when making concentrates or solutions in the real world through inadvertent error in these procedures; through differences in the manufacture, source, or purity of the ingredients employed to make the compositions or carry out the methods; and the like. The term "about" also encompasses amounts that differ due to different equilibrium conditions for a composition resulting from a particular initial mixture. Whether or not modified by the term "about", the claims include equivalents to the quantities.

Although the terms first, second, third, etc. may be used herein to describe various elements, components, regions, layers and/or sections, these elements, components, regions, layers and/or sections should not be limited by these terms.

These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A thermal interface material assembly comprising:
    a substrate;
    one or more thermally-conductive pillars protruding outwardly away from the substrate, the one or more thermally-conductive pillars comprise metal or metal alloy; and
    a thermally-conductive heat path at least partially defined by and through the substrate and the one or more thermally-conductive pillars, whereby heat may be transferable along the thermally-conductive heat path from a heat source of an electronic device to a heat dissipating device.

2. The thermal interface material assembly of claim 1, wherein each said thermally-conductive pillar comprises a copper pillar having a first end portion in thermal contact with the substrate and a second end portion opposite the first end portion, and wherein a thermally-conductive solder is in thermal contact with the second end portion of the copper pillar, the thermally-conductive solder having a softening temperature and a thermal conductivity less than the copper pillar.

3. The thermal interface material assembly of claim 2, wherein the thermally-conductive solder comprises a solder ball.

4. The thermal interface material assembly of claim 2, wherein the thermally-conductive solder comprises:
    a metal alloy having a melting temperature of about 160 degrees Celsius or less; and/or
    a low melting temperature phase change metal alloy; and/or
    $In_{51}Bi_{32.5}Sn_{16.5}$; and/or
    a low melting temperature phase change metal alloy having a melting temperature of about 60 degrees Celsius.

5. The thermal interface material assembly of claim 1, wherein:
    the substrate is a single substrate having first and second oppositely facing side portions; and
    the one or more thermally-conductive pillars comprise multiple thermally-conductive pillars along each of the first and second oppositely facing side portions of the same single substrate.

6. The thermal interface material assembly of claim 1, further comprising a coating that covers at least part of the substrate and at least part of the one or more thermally-conductive pillars and that inhibits oxidation.

7. The thermal interface material assembly of claim 6, wherein:
    the coating inhibits oxidation by functioning as a barrier to air; and/or
    the coating is a grease, a cured silicone pad, a cured non-silicone pad, a cure-in-place gel, a cure-in-place putty, or a paraffin wax.

8. An electronic device comprising a heat source, a heat dissipating device, and the thermal interface material assembly of claim 1 positioned between the heat source and the heat dissipating device, such that the thermal interface material assembly defines the thermally-conductive heat path from the heat source through the substrate and the one or more thermally-conductive pillars to the heat dissipating device, whereby heat may be transferred along the thermally-conductive heat path from the heat source to the heat dissipating device, and wherein each said thermally-conductive pillar comprises a copper pillar having oxidation resistance protection.

9. A thermal interface material assembly comprising;
    a substrate;
    one or more thermally-conductive pillars along the substrate; and
    a thermally-conductive heat path at least partially defined by the substrate and the one or more thermally-conductive pillars, whereby heat may be transferable along the thermally-conductive neat path from a heat source of an electronic device;
    wherein:
    each said thermally-conductive pillar comprises a copper pillar having a first end portion in thermal contact with the substrate, a second end portion opposite the first end portion, and a contact resistance reducer in thermal contact with the second end portion of the copper pillar, the contact resistance reducer having a softening temperature and a thermal conductivity less than the copper pillar;
    a thermally-conductive coating covers at least part of the substrate, at least part of the copper pillar, and at least part of the contact resistance reducer, the thermally-conductive coating having a softening temperature equal to or less than the softening temperature of the contact resistance reducer, whereby the thermally-conductive coating inhibits oxidation by functioning as a barrier to air and contains migration of the contact resistance reducer.

10. A thermal interface material assembly comprising:
    a substrate;
    one or more thermally-conductive pillars along the substrate; and
    a thermally-conductive heat path at least partially defined by the substrate and the one or more thermally-conductive pillars, whereby heat may be transferable along the thermally-conductive heat path from a heat source of an electronic device;

wherein:

each said thermally-conductive pillar comprises a copper pillar having a first end portion in thermal contact with the substrate, a second end portion opposite the first end portion, and a low melting temperature metal alloy in thermal contact with the second end portion of the copper pillar, the low melting temperature metal alloy having a melting temperature of about 160 degrees Celsius or less; and a thermally-conductive coating covers at least part of the substrate, at least part of the copper pillar, and at least part of the low temperature melting alloy, the thermally-conductive coating having a thermal conductivity of at least 1 Watt per meter per Kelvin and a softening temperature equal to or less than the melting temperature of the low melting temperature metal alloy.

11. A thermal interface material assembly comprising:

a substrate;

one or more pillars protruding outwardly away from the substrate, each said pillar having a first end portion in thermal contact with the substrate and a second end portion opposite the first end portion;

one or more contact resistance reducers, each said contact resistance reducer in thermal contact with the second end portion of a corresponding one of the one or more pillars, the one or more contact resistance reducers having a softening temperature and a thermal conductivity less than the one or more pillars; and a thermally-conductive heat path at least partially defined by and through the substrate, the one or more pillars, and the one or more contact resistance reducers, whereby heat may be transferable along the thermally-conductive heat path from a heat source of an electronic device to a heat dissipating device.

12. The thermal interface assembly of claim 11, wherein:

the one or more pillars comprise copper; and the one or more contact resistance reducers comprises thermally-conductive solder.

13. The thermal interface material assembly of claim 11, wherein the one or more contact resistance reducers comprise:

a metal alloy having a melting temperature of about 160 degrees Celsius or less; and/or $In_{51}Bi_{32.5}Sn_{16.5}$; and/or a low melting temperature phase change metal alloy having a melting temperature of about 60 degrees Celsius.

14. The thermal interface material assembly of claim 11, wherein:

the substrate is a single substrate having first and second oppositely facing side portions; and the one or more pillars comprise multiple pillars along each of the first and second oppositely facing side portions of the same single substrate.

15. The thermal interface material assembly of claim 11, further comprising a coating that covers at least part of the substrate and at least part of the one or more pillars and that inhibits oxidation.

16. The thermal interface material assembly of claim 15, wherein:

the coating inhibits oxidation of the one or more pillars by functioning as a barrier to air and contains migration of the one or more contact resistance reducers; and/or the coating is a grease, a cured silicone pad, a cured non-silicone pad, a cure-in-place gel, a cure-in-place putty, or a paraffin wax.

* * * * *